(12) United States Patent
Lue et al.

(10) Patent No.: US 10,727,243 B1
(45) Date of Patent: Jul. 28, 2020

(54) THREE DIMENSIONAL MEMORY DEVICE FABRICATING METHOD AND APPLICATIONS THEREOF

(71) Applicant: MACRONIX INTERNATIONAL CO., LTD., Hsinchu (TW)

(72) Inventors: Hang-Ting Lue, Hsinchu (TW); Wei-Chen Chen, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/407,319

(22) Filed: May 9, 2019

(51) Int. Cl.
| | |
|---|---|
| *H01L 27/115* | (2017.01) |
| *H01L 27/11556* | (2017.01) |
| *H01L 27/11526* | (2017.01) |
| *H01L 27/11521* | (2017.01) |
| *H01L 21/02* | (2006.01) |
| *H01L 21/311* | (2006.01) |
| *H01L 21/762* | (2006.01) |
| *H01L 21/3213* | (2006.01) |
| *H01L 21/28* | (2006.01) |

(Continued)

(52) U.S. Cl.
CPC .. *H01L 27/11556* (2013.01); *H01L 21/02532* (2013.01); *H01L 21/02595* (2013.01); *H01L 21/02636* (2013.01); *H01L 21/31116* (2013.01); *H01L 21/32137* (2013.01); *H01L 21/76224* (2013.01); *H01L 27/11521* (2013.01); *H01L 27/11526* (2013.01); *H01L 29/40114* (2019.08); *H01L 21/76227* (2013.01); *H01L 21/76232* (2013.01); *H01L 27/11551* (2013.01); *H01L 27/11568* (2013.01)

(58) Field of Classification Search
None
See application file for complete search history.

(56) References Cited

U.S. PATENT DOCUMENTS

| | | | |
|---|---|---|---|
| 9,484,353 B1* | 11/2016 | Lai | H01L 27/11556 |
| 2011/0032772 A1* | 2/2011 | Aritome | H01L 29/66825 365/185.29 |

(Continued)

OTHER PUBLICATIONS

Lue, et al.: "A Novel 3D AND-type NVM Architecture Capable of High-density, Low-power In-Memory Sum-of-Product Computation for Artificial Intelligence Application"; 2018 IEEE Sumposium on VLSI Technology; Jun. 2018; pp. 1-2.

*Primary Examiner* — Minh Loan Tran
(74) *Attorney, Agent, or Firm* — McClure, Qualey & Rodack, LLP

(57) ABSTRACT

A 3D memory device includes a multi-layers stacking structure having a plurality of conductive layers and insulating layers stacked in a staggered manner, at least one trench passing through the conductive layers and a plurality of recess regions extending into the conductive layers from the trench; a dielectric blocking strip lining sidewalls of the trench and the recess regions; a plurality of floating gates disposed in the recess regions and isolated from the conductive layers by the dielectric blocking strip; a dielectric strip overlies sidewalls of the floating gates exposed from the recess regions; a semiconductor strip disposed in the trench, insulated from the floating gates by the dielectric strip, and includes a first doping region, a second doping region and a channel region disposed between and connects to the first doping region and the second doping region, and overlapping with the floating gates.

15 Claims, 13 Drawing Sheets

(51) Int. Cl.
*H01L 27/11568* (2017.01)
*H01L 27/11551* (2017.01)

(56) References Cited

U.S. PATENT DOCUMENTS

2012/0092926 A1\* 4/2012 Whang ............. H01L 29/66825
 365/185.01
2014/0203344 A1\* 7/2014 Hopkins ........... H01L 21/28035
 257/316
2016/0163728 A1\* 6/2016 Tsutsumi .......... H01L 27/11582
 257/66

\* cited by examiner

THREE DIMENSIONAL MEMORY DEVICE FABRICATING METHOD AND APPLICATIONS THEREOF

BACKGROUND

Technical Field

The disclosure in generally relates to a memory device, fabricating method and applications thereof, and more particularly to a high-density three dimensional (3D) memory device, the fabricating method thereof, and applying the same for execution of a sum-of-products operation.

Description of the Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function. The most popular computing memory design (cross-point array architectures) for realize the sum-of-products function is a NOR-type array, where one transistor is often connected with a resistor memory such as ReRAM or PCM, referred to as 1T1R structure.

However, the 1T1R structure has some disadvantages. For example, it has limited scaling capability (a limited memory density much below 1 Gb) thus is not cost effective. Besides, the programming current of ReRAM or PCM is high (>50 uA for each cell) thus does not allow highly parallel programming; and the resistor devices of ReRAM or PCRAM are often highly non-linear with respect to the applied bias which makes analog computing difficult.

Therefore, there is a need of providing an improved 3D memory device and the method for fabricating the same to obviate the drawbacks encountered from the prior art.

SUMMARY

One aspect of the present disclosure is to provide a 3D memory device, wherein the 3D memory device includes a multi-layers stacking structure, a dielectric blocking strip, a plurality of floating gates, a dielectric strip, and a semiconductor strip. The multi-layers stacking structure includes a plurality of conductive layers, a plurality of insulating layers, at least one trench and a plurality of recess regions, wherein the insulating layers and the conductive layers are stacked along a stacking direction in a staggered manner, the trench passes through the conductive layers, and each of the recess regions extends into one of the conductive layers from the trench. The dielectric blocking strip is disposed in the trench and the recess regions to at least partially overlapping the plurality of conductive layers. Each of the floating gates is disposed in one of the recess regions and isolated from the conductive layers by the dielectric blocking strip. The dielectric strip is disposed in the trench and overlies sidewalls of the floating gates that are exposed from the recess regions. The semiconductor strip is disposed in the trench, insulated from the floating gates by the dielectric strip, and includes a first doping region, a second doping region and a channel region, wherein both is of the first doping region and the second doping region are disposed adjacent to the floating gates, and the channel region is disposed between and connects to the first doping region and the second doping region, and overlapping with each of the plurality of floating gates.

Another aspect of the present disclosure is to provide a 3D memory device, wherein the 3D memory device includes a multi-layers stacking structure, a dielectric blocking strip, a plurality of floating gates, a dielectric strip comprising silicon oxide, and a semiconductor strip. The multi-layers stacking structure includes a plurality of conductive layers, a plurality of insulating layers, at least one trench and a plurality of recess regions, wherein the insulating layers and the conductive layers are stacked along a stacking direction in a staggered manner, the trench passes through the conductive layers, and each of the recess regions extends into one of the conductive layers from the trench. The dielectric blocking strip is disposed in the trench and the recess regions to at least partially overlapping the plurality of conductive layers. Each of the floating gates is disposed in one of the recess regions and isolated from the conductive layers by the dielectric blocking strip. The dielectric strip comprising silicon oxide is disposed in the trench and overlies sidewalls of the floating gates that are exposed from the recess regions. The semiconductor strip is disposed in the trench, insulated from the floating gates by the dielectric strip, and includes a first doping region, a second doping region and a channel region, wherein both of the first doping region and the second doping region are disposed adjacent to the floating gates, and the channel region is disposed between and connects to the first doping region and the second doping region, and overlapping with each of the plurality of floating gates Yet another aspect of the present disclosure is to provide a method for fabricating a 3D memory device, wherein the method includes steps as follows: A multi-layers stacking structure is provided, wherein the multi-layers stacking structure includes a plurality of conductive layers, a plurality of insulating layers, at least one trench and a plurality of recess regions; the insulating layer and the conductive layers are stacked along a stacking direction in a staggered manner; the trench passes through the conductive layers; and each one of the plurality of recess regions extends into one of the conductive layers from the trench. A dielectric blocking strip is formed in the trench and the recess regions to at least partially overlapping the conductive layers. A plurality of floating gates are formed, and each of which is disposed in one of the recess regions and isolated from the conductive layers by the dielectric blocking strip. A dielectric strip is formed in the trench and overlies sidewalls of the floating gates exposed from the recess regions. A semiconductor strip is formed in the trench to make the semiconductor strip being insulated from the floating gates by the dielectric strip, wherein the semiconductor strip includes a first doping region, a second doping region and a channel region, both of the first doping region and the second doping region are disposed adjacent to the floating gates, and the channel region is disposed between and connects to the first doping region and the second doping region, and overlaps with each of the plurality of floating gates.

Meanwhile, the twisted layout structure that can automatically separate the bit lines and source lines respectively connecting to two different stacks of memory cells by a lateral shift. Such that the sneak paths problems occur during programming operation can be prevented. In addition, the floating gate can be configured to further improve the retention reliability of the 3D memory device.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
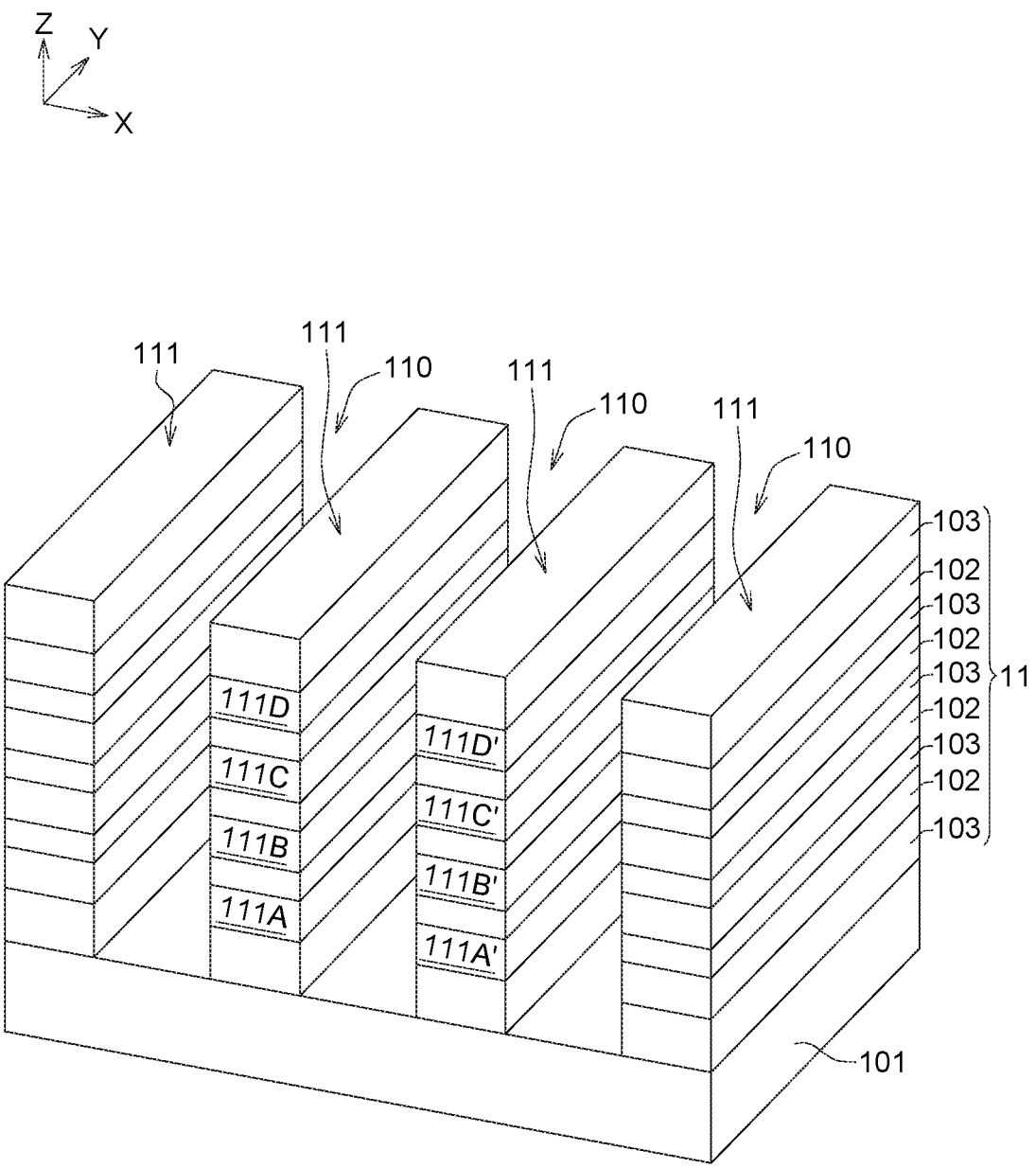
FIGS. 1A-1I are prospective views illustrating the processing structure for fabricating a 3D memory device, in accordance with one embodiment of the present disclosure.

The embodiments as illustrated below provide a 3D memory device, the method for fabricating the same and applications thereof to perform sum-of-products operations. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

FIGS. 1A-1I are prospective views illustrating the processing structure for fabricating a 3D memory device 10, in accordance with one embodiment of the present disclosure. The method for fabricating the 3D memory device 10 includes steps as follows: Firstly, a multi-layers stacking structure 11 is provided on a substrate 101, wherein the multi-layers stacking structure 11 includes a plurality of conductive layers 102 and a plurality of insulating layers 103 stacked along a stacking direction (the direction parallel to the Z-axis) in a staggered manner.

In some embodiments of the present disclosure, the conductive layers 102 can be formed of metal (such as copper (Cu), aluminum (Al), tungsten (W) or the metal ally thereof), doped or undoped semiconductor material (such as epitaxial single crystal silicon or poly-silicon (Si)/germanium (Ge) or other suitable material. The insulating layers 103 can be formed of a dielectric material such as silicon oxide, silicon nitride, silicon oxynitride, silicate, or others.

Next, the multi-layers stack 11 is patterned to form a plurality of trenches 110 penetrating through the conductive layer 102 and dividing the multi-layers stacking structure 11 into a plurality of ridge structures 111 (see FIG. 1A). In some embodiments of the present disclosure, the process for patterning the multi-layers stacking structure 11 comprises steps as follows: A patterned hard mask layer (not shown) is firstly provided on a top surface of the multi-layers stacking structure 11, and an anisotropic etching process, such as reactive ion etching (RIE) process is performed using the patterned hard mask (not shown) as an etching mask to remove a portion of the multi-layers stacking structure 11, so as to form a plurality of the trenches 110 laterally extending along the Y-axis and vertically extending along the Z-axis.

Each of the ridge structures 111 include a plurality of conductive strips (such as the conductive strips 111A-111D and 111A-111D') formed by the remaining portions of the conductive layer 102 respectively disposed on different levels, and insulated from each other by the remaining insulating layers 103.

Figure 1B:
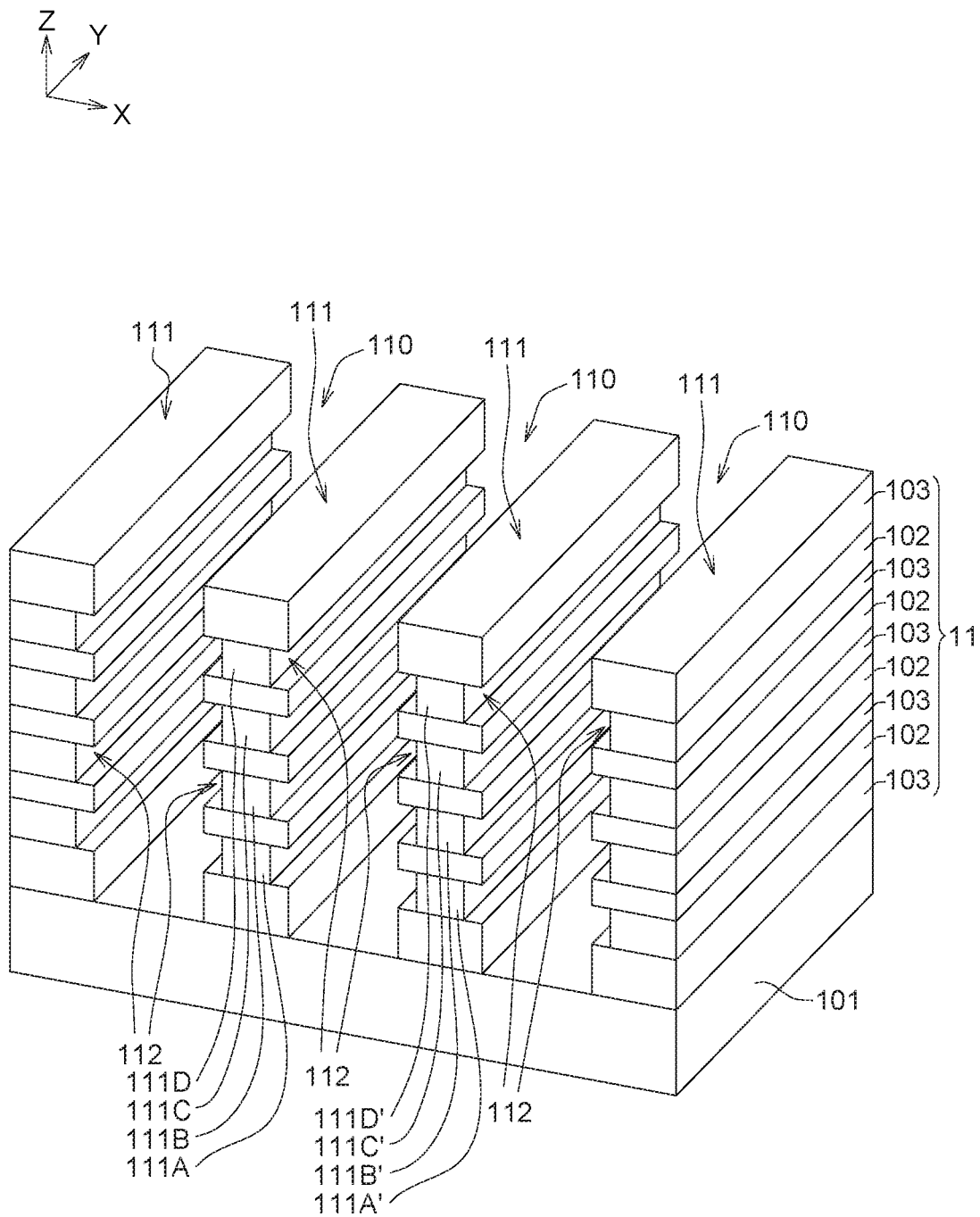
Figure 1C:
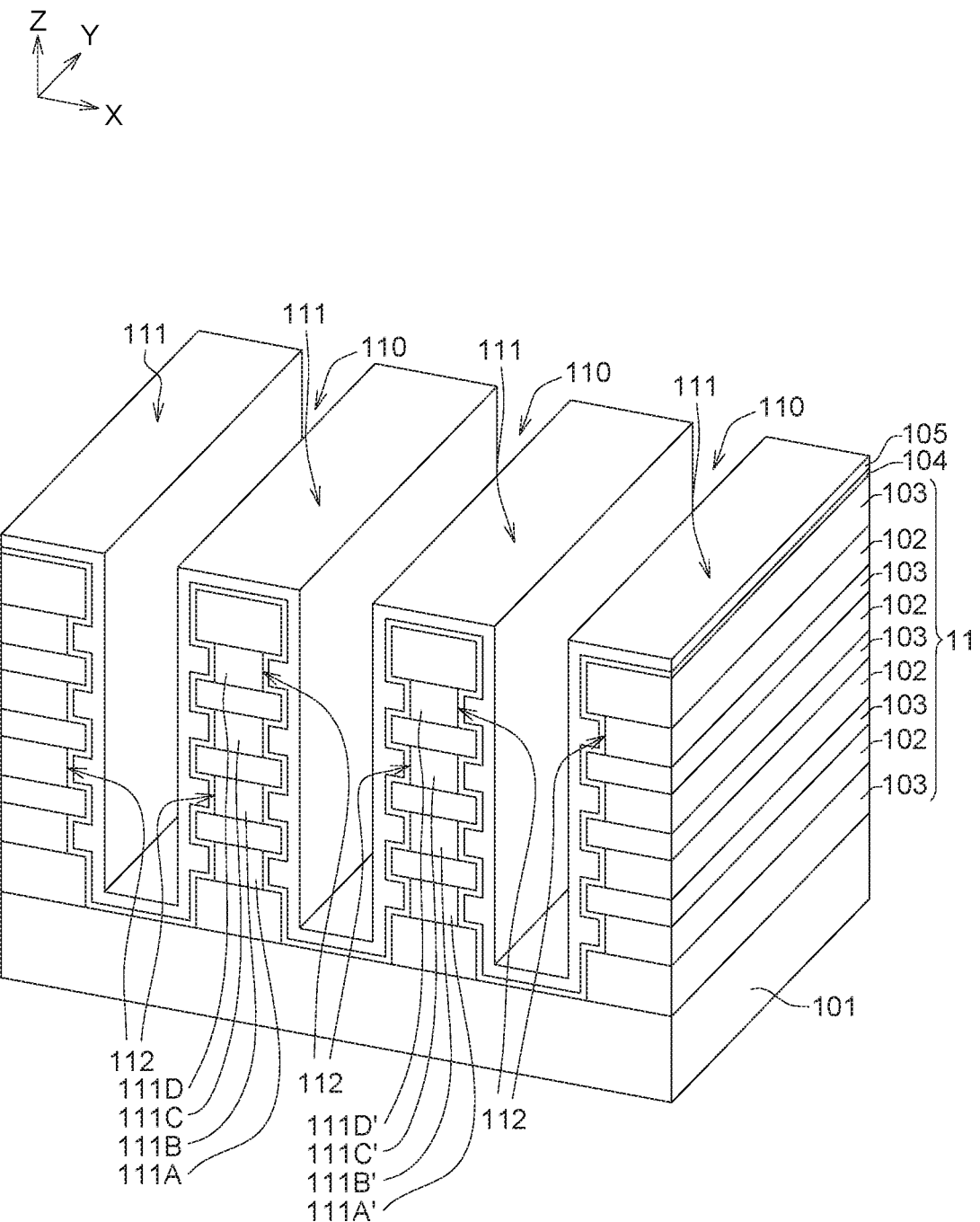

Next, an etch back process is performed to remove portions of the conductive layers 102 (conductive strips 111A-111D and 111A'-111D') through the trenches 110, so as to form a plurality of recess regions 112 (see FIG. 1B). In some embodiments of the present disclosure, each one of the recess regions 112 is a lateral recess extending (along the direction parallel to the X-axis) into one of the conductive layers 102 (e.g. the conductive strip 111B) from the corresponding trench 110. As a result, each of the recess regions 112 connects to the corresponding trench 110, and portions of two insulating layers 103 adjacent to the corresponding conductive layer 102 (e.g. the conductive strip 111B) may be exposed from the lateral recess and the corresponding trench 110. In the present embodiment, each one of the recess regions 112 can be defined by the etched sidewall of the conductive layer 102 (e.g. the conductive strip 111B) and the two insulating layers 103 adjacent to the corresponding conductive layer 102 (the conductive strip 111B).

A dielectric blocking layer 104 is then formed in the trenches 110 and the recess regions 112. In some embodiments of the present disclosure, the dielectric blocking layer 104 is formed by a deposition process (such as a low pressure chemical vapor deposition (LPCVD)) blanket over the sidewalls and the bottom of the trenches 110 and lining on the sidewalls of the sidewalls of the recess regions 112, The material used to constitute the dielectric blocking layer 104 may include silicon oxide. For example, in the present embodiment, the dielectric blocking layer 104 may be formed of a composite layer including a silicon oxide layer, a silicon nitride layer, and a silicon oxide layer (i.e., an ONO structure), In some other embodiments, the composite layer of the dielectric blocking layer 104 may include an oxide-nitride-oxide-nitride-oxide (ONONO) structure.

After the dielectric blocking layer 104 is formed, the recess regions 112 are filled with poly-silicon 105. In some embodiments of the present disclosure, the poly-silicon 105 may be also formed by a deposition process (such as a LPCVD). In the present embodiment, the deposited poly-silicon 105 may fulfill the recess regions 112 through the trenches, and further cover the top surface of the multi-layers stacking structure 11, the sidewalls and the bottom of the trenches 110 (See FIG. 10). In this embodiment, the poly silicon 105 is function as floating gate.

Figure 1D:
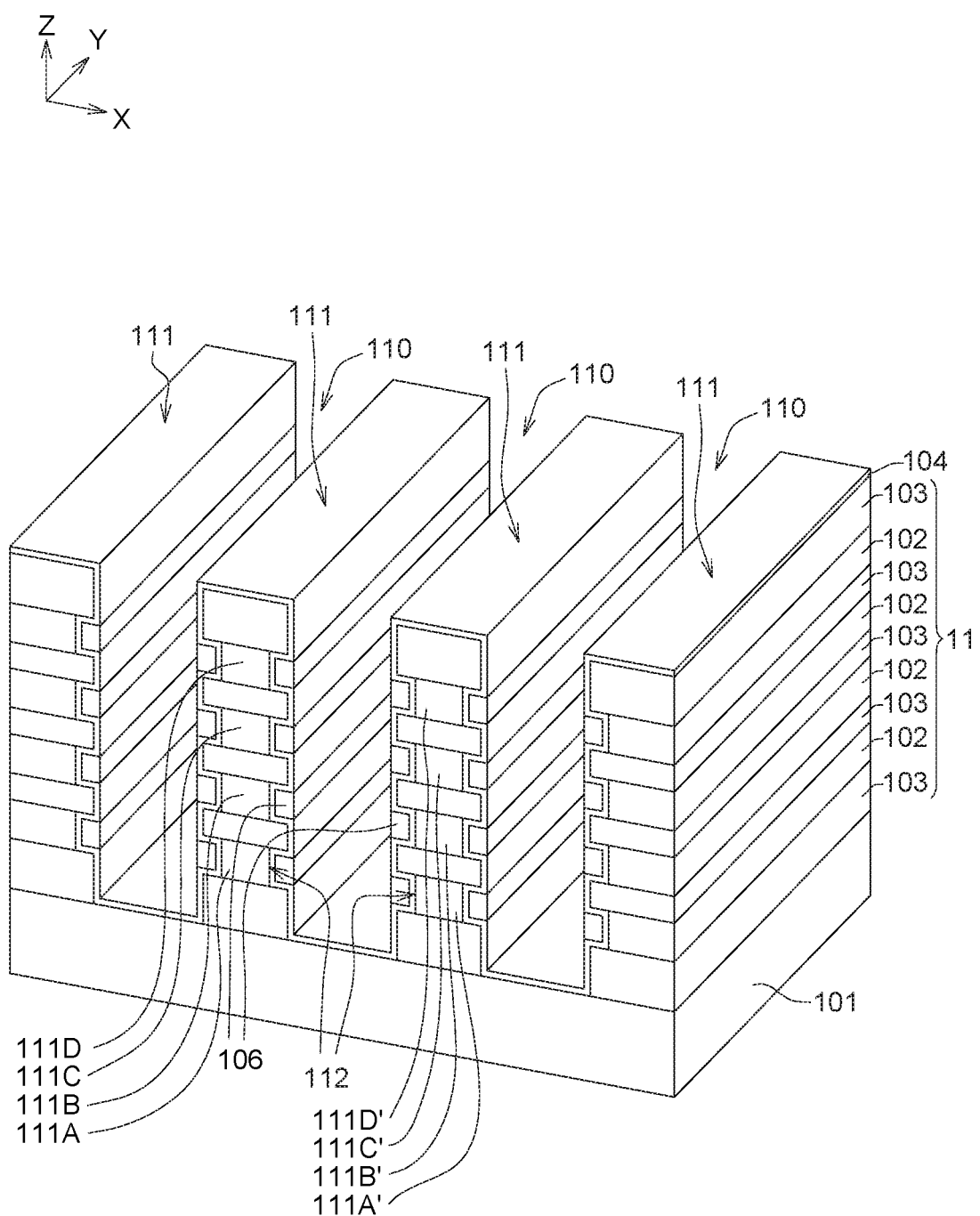
Figure 1E:
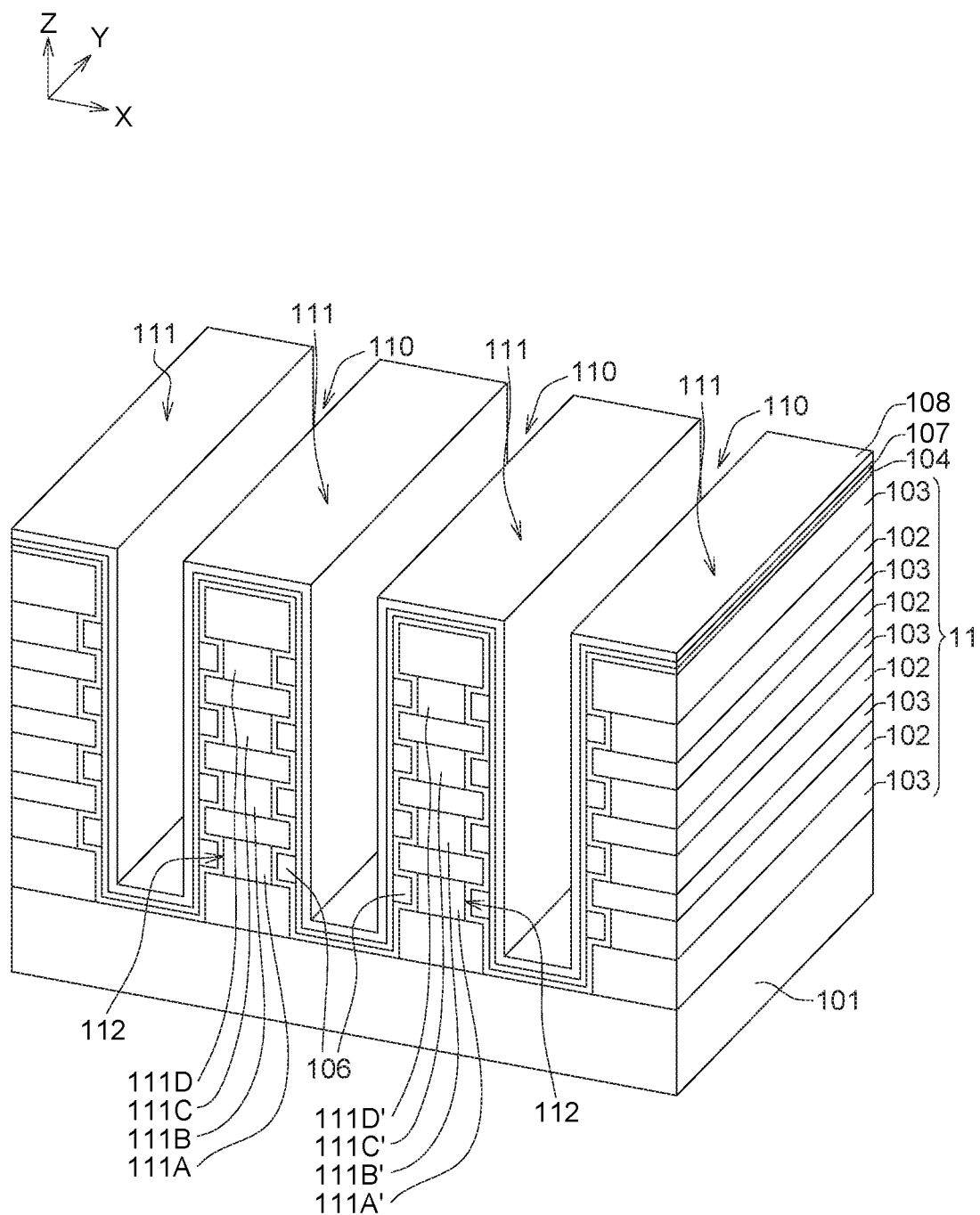

Subsequently, another etch back process is performed to remove the portions of the poly-silicon 105 disposed on the top surface of the multi-layers stacking structure 11, the sidewalls and the bottom of the trenches 110, so as to form a plurality of poly-silicon bars 106 laterally extending towards to the corresponding conductive layer 102 (the conductive strip 111B) (along the direction parallel to X-axis), and extending along the direction parallel to the extending direction of trenches 110 (along the direction parallel to the Y-axis) (see FIG. 1D).

A dielectric layer 107 is then formed in the trenches 110 and overlies sidewalls of the poly-silicon bars 106 exposed from the recess regions 112; so as to make the poly-silicon bars 106 surrounded by the dielectric blocking layer 104 and the dielectric layer 107. Next, a semiconductor layer 108 is formed in the trenches 110 and overlies the dielectric layer 107, wherein the semiconductor layer 108 is insulated from the poly-silicon bars 106 by the dielectric layer 107 (see FIG. 1E).

In some embodiments of the present disclosure, the dielectric layer 107 can be a tunneling oxide layer made of silicon oxide. The semiconductor layer 108 can be made of semiconductor materials (such as polysilicon), or other suitable materials for channel layer.

Figure 1F:
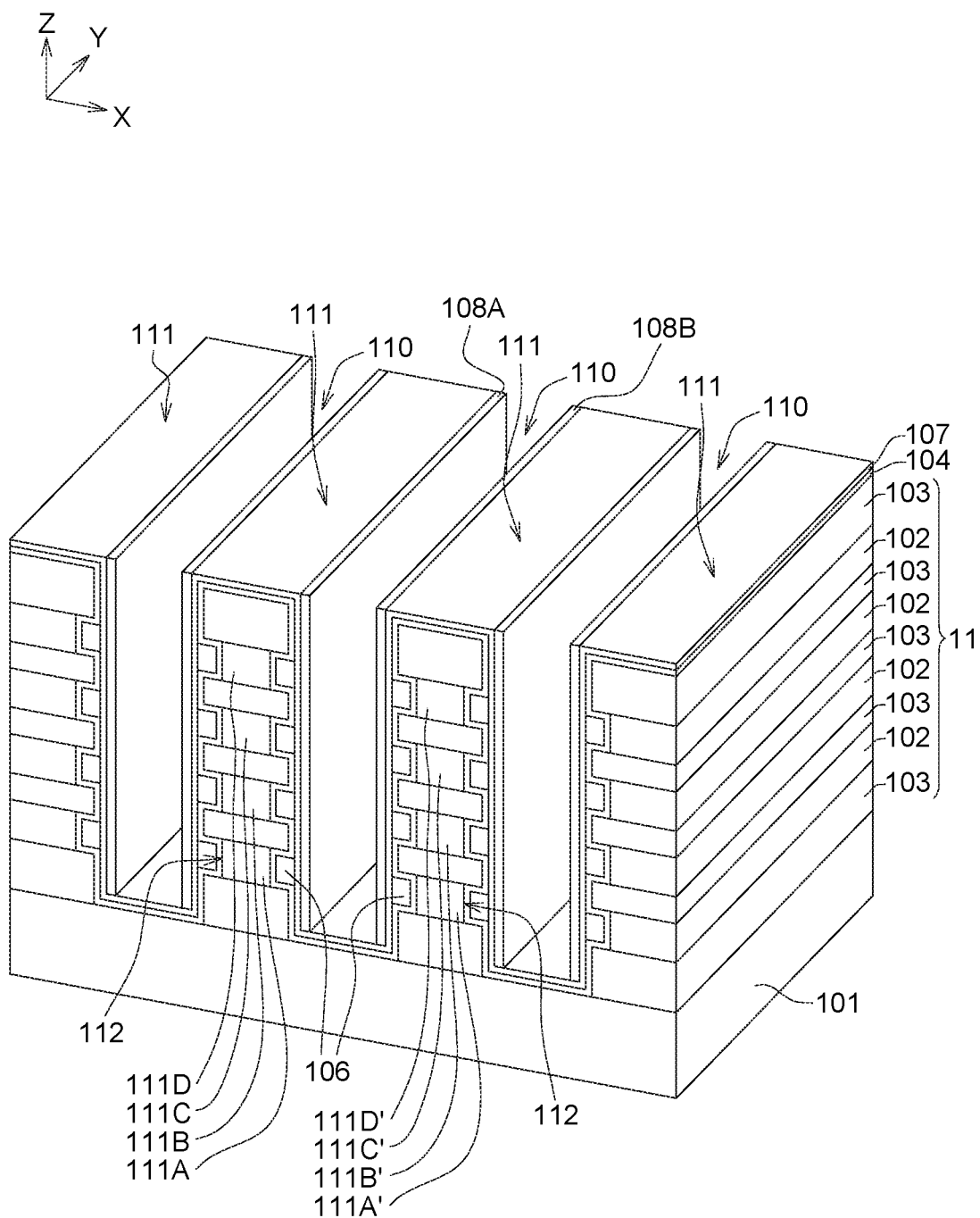
Figure 1G:
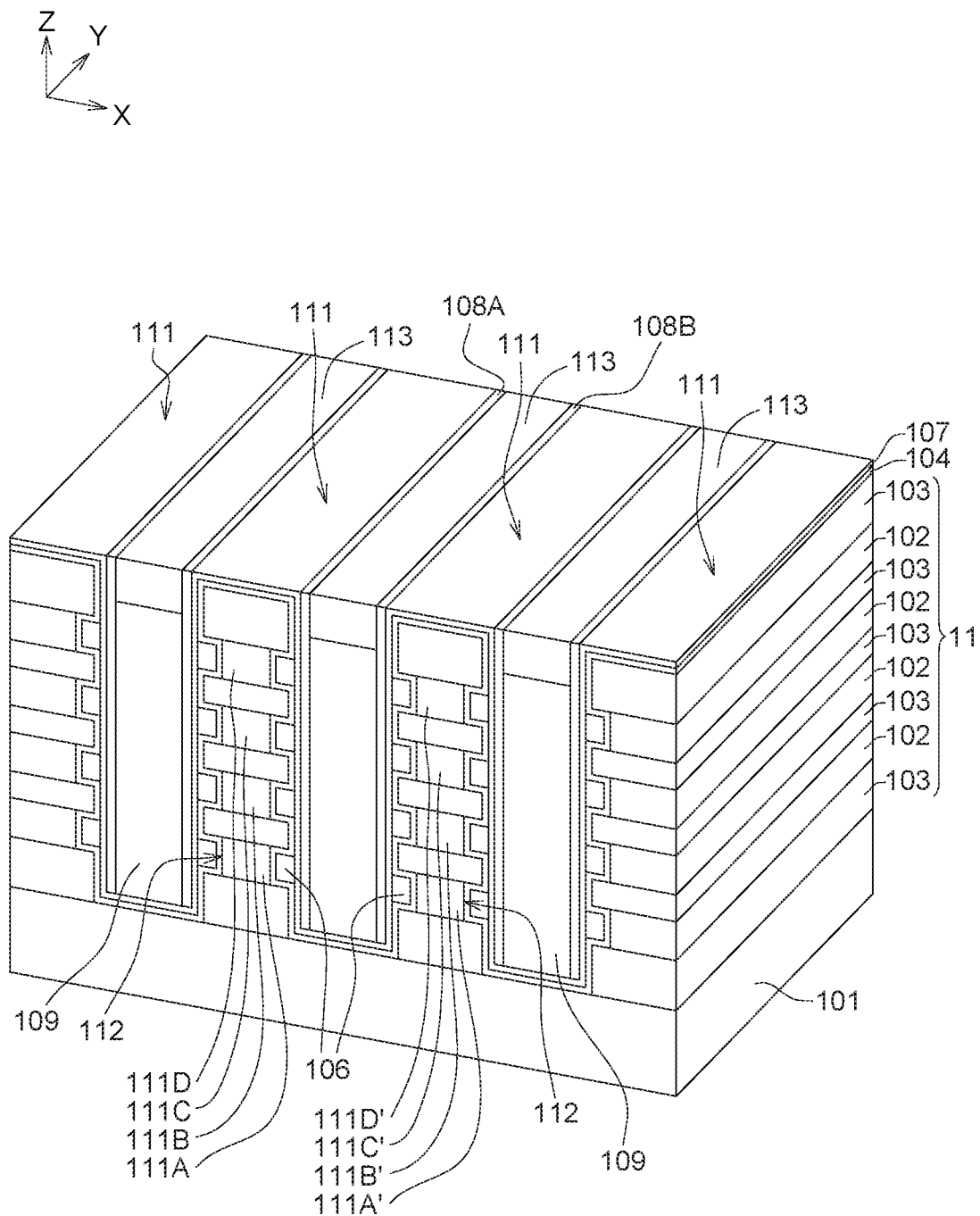

An etching process; using the dielectric layer 107 a stop layer; is performed to remove the portions of the semiconductor layer 108 disposed on the top surface of the multi-layers stacking structure 11 and the bottom of the trenches 110, whereby two separated semiconductor spacer 108A and 108B can be formed on two opposite sidewalls of each of the trenches 110 by the remaining portions of the layer 108 disposed (see FIG. 1F).

After the trenches 110 are fulfilled with a dielectric material 109, yet another etching back process is performed to remove a portion of the dielectric material 109 and to form a plurality of slots (not shown) aligning the trenches 110 to expose a portion of the semiconductor layer 108 (the semiconductor spacer 108A and 108B); and the slots (not shown) are then filled by conductive material to form a plurality of contact plug 113 connecting to the exposed portions of the semiconductor layer 108 (the top portions of the semiconductor spacer 108A and 108B). In some embodiments of the present disclosure, the dielectric material 109 includes silicon oxide; and the conductive material used to form the contact plug 113 may include metal (such as Cu, Al, W or the metal ally thereof), doped or undoped semiconductor material (such as epitaxial single crystal silicon or poly-silicon (Si)/germanium (Ge) or other suitable material.

Subsequently, an etching process is performed to form at least two openings 120 extending downwards along a direction parallel to the stacking direction (parallel to the Z-axis) from a top surface of the multi-layers stacking structure 11 and passing through the dielectric blocking layer 104, the poly-silicon bars 106, the dielectric layer 107, the dielectric material 109 and the semiconductor spacers 108A and 108B disposed in one of the trenches 110 (see FIG. 1H). Each poly-silicon bar 106 are separated into several segments arranged along the Y-axis by at least one of the openings 120, and the poly-silicon segments are electrically isolated from each other.

Figure 1H:
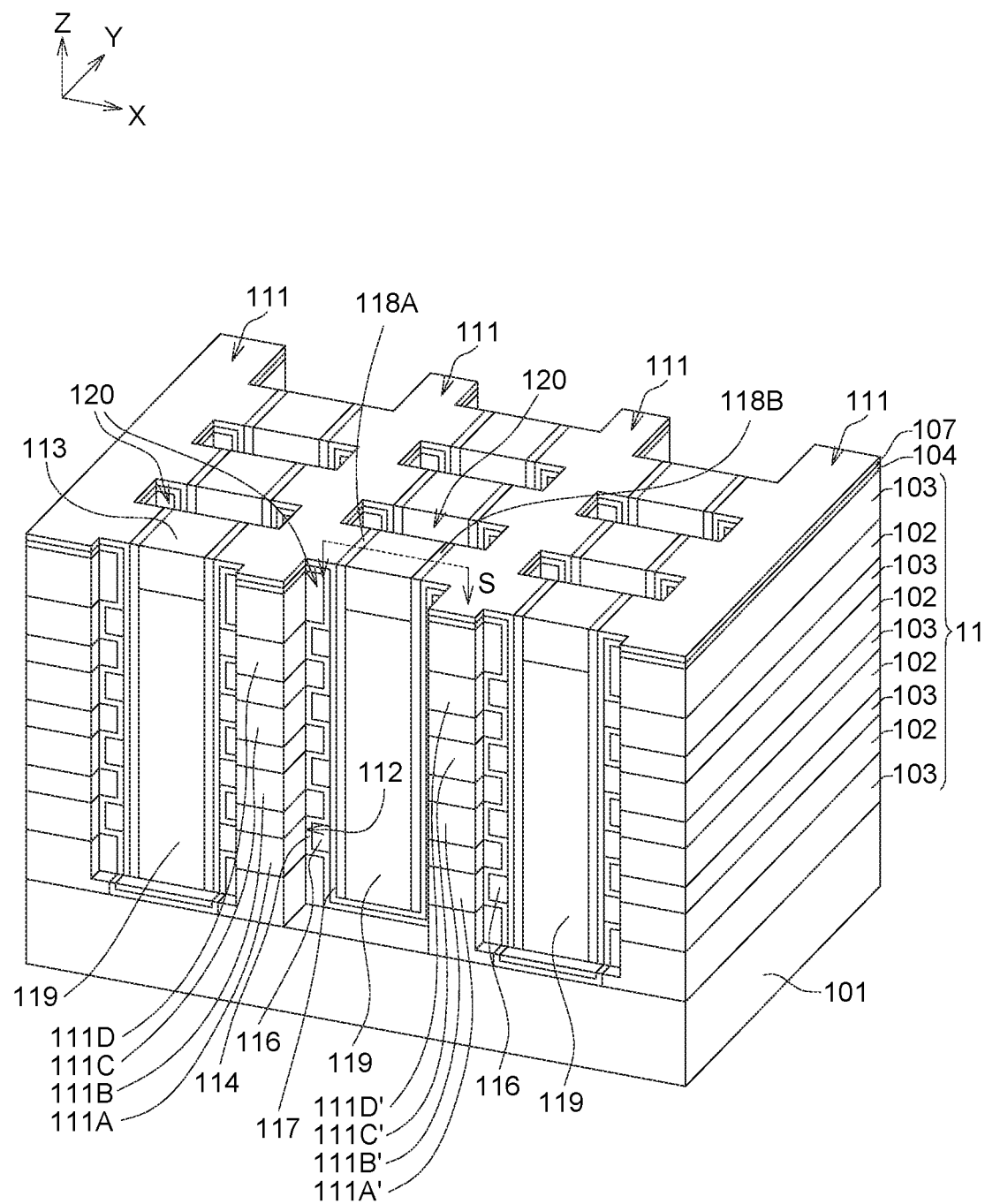
Figure 2:
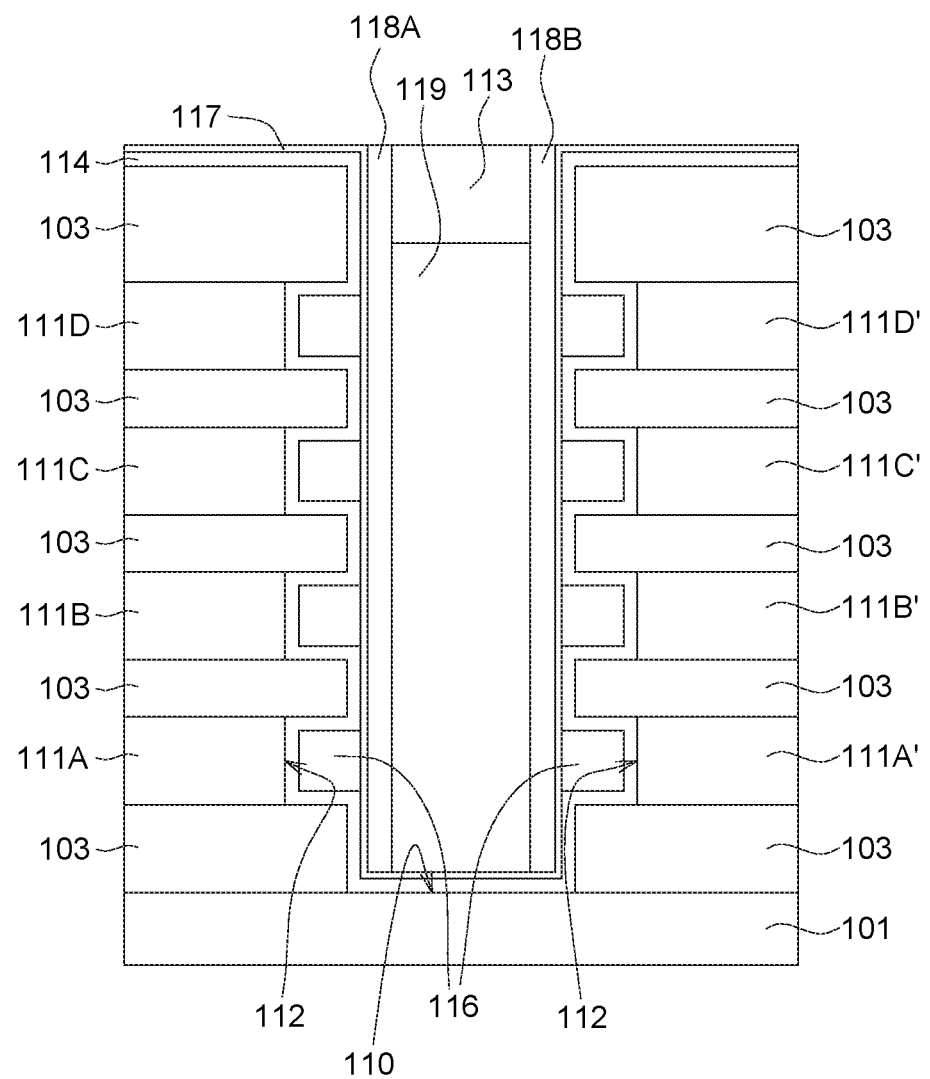
FIG. 2 is a cross-sectional view taken along the cutting line S as shown in FIG. 1H.

FIG. 2 is a cross-sectional view taken along the cutting line S as shown in FIG. 1H. In the present embodiment, each of the poly-silicon bars 106 disposed in the corresponding trench 110 can be divided into a plurality of floating gates 116 disposed on the same level. The portion of the dielectric layer 107 disposed in the corresponding trenches 110 can be divided into a plurality of U-shaped dielectric strips 117, and each of which extends downwards, along one sidewall of the corresponding trench 110, from the top surface of the multi-layers stacking structure 11 to the bottom of the corresponding trenches 110, comes across the bottom of the corresponding trench 110, and then extends upwards, along the opposite sidewall of the corresponding trench 110, to the top surface of the multi-layers stacking structure 11. The portion of the dielectric material 109 disposed in the corresponding trench 110 can be divided into a plurality of dielectric pillars 119. These two semiconductor spacers 108A and 108B disposed in the corresponding trench 110 can be divided into a plurality pairs of semiconductor strips (such as the semiconductor strips 118A and 118B), respectively overlying on two opposite sides of each U-shaped dielectric strips 117 and separated by a corresponding dielectric pillar 119.

The portion of the dielectric blocking layer 104 disposed in the corresponding trench 110 and the recess regions 112 can be divided into a plurality of U-shaped dielectric blocking strips 114, and each of which extends downwards, along one sidewall of the corresponding trench 110 and the sidewalls of the recess regions 112 connecting to the sidewall of the corresponding trench 110, from the top surface of the multi-layers stacking structure 11 to the bottom of the corresponding trenches 110, comes across the bottom of the corresponding trenches 110, and then extends upwards, along the opposite sidewall of the corresponding trenches 110 and the sidewalls of the recess regions 112 connecting to the opposite sidewall of the corresponding trench 110, to the top surface of the multi-layers stacking structure 11.

Each one of the U-shaped dielectric blocking strips 114 may overlap with one of the U-shaped dielectric strips 117, two opposite semiconductor strips 118A and 118B and two stacks of floating gates 116 that are respectively stacked along the stacking direction. In the present embodiment, the floating gates 116 may be isolated from each other in all directions (such as the directions respectively parallel to the X-axis, the Y-axis and the Z-axis), and each of the floating gates 116 may be surrounded by the U-shaped dielectric blocking strips 114 and one of the two opposite semiconductor strips 118.

Figure 1I:
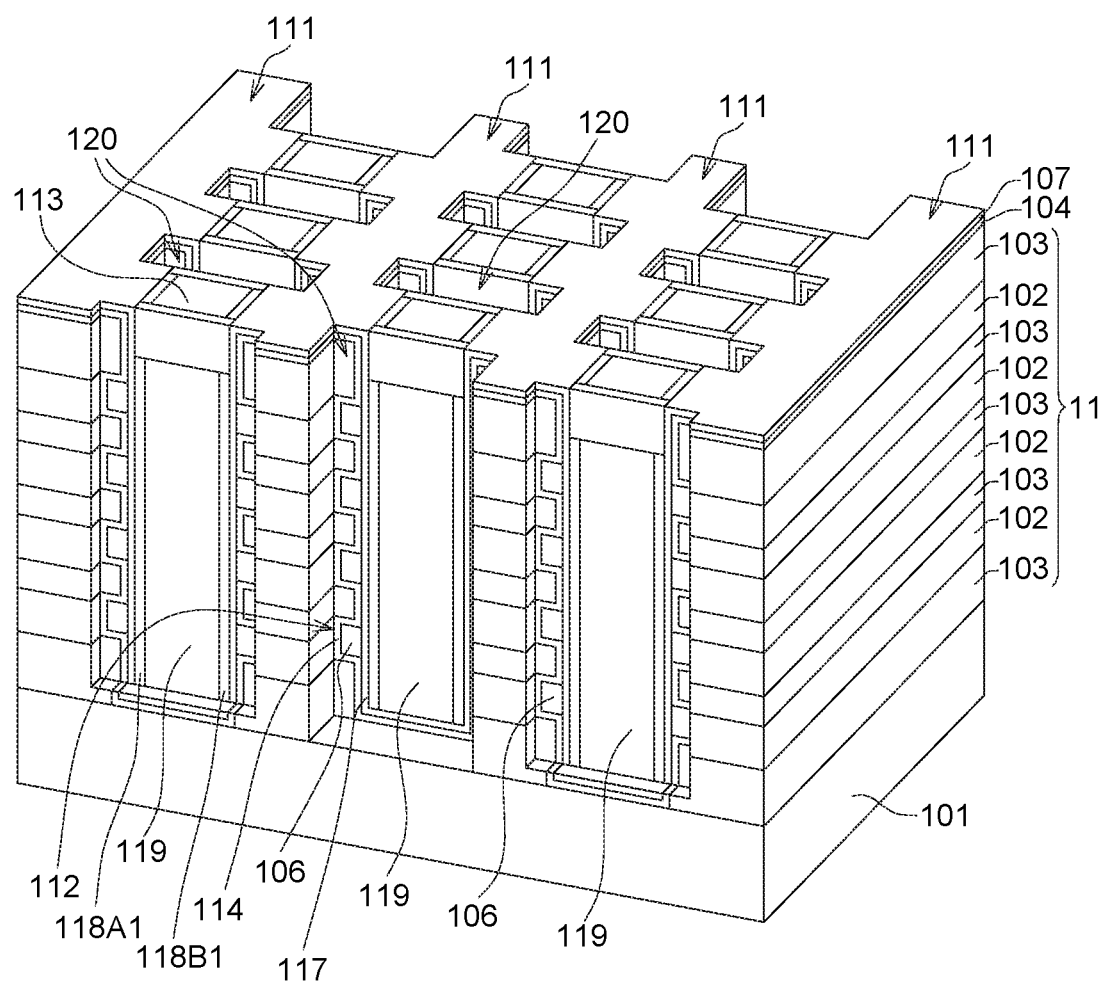
Figure 3:
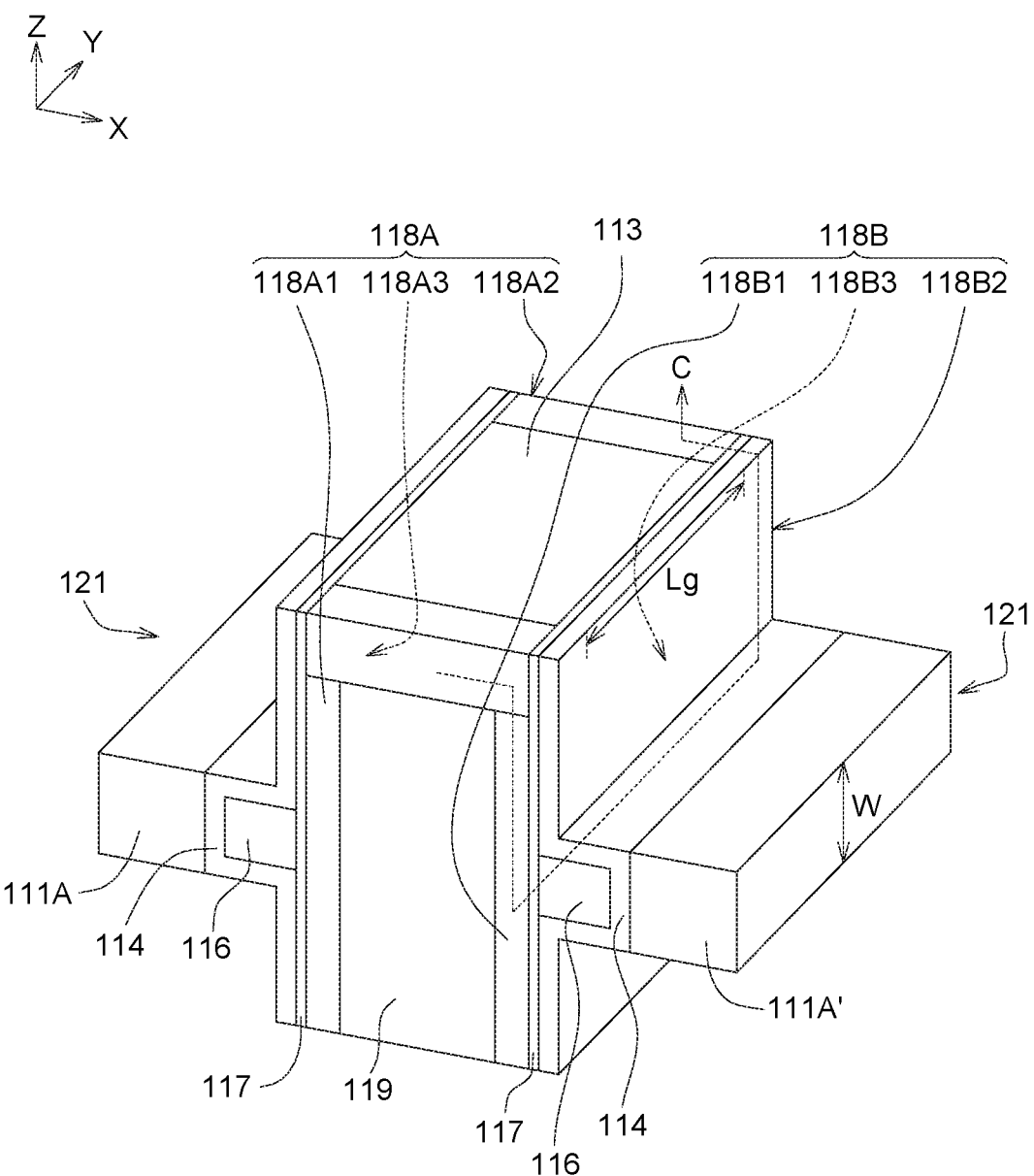
FIG. 3 is a prospective view illustrating one of the memory cells formed on sidewalls of the corresponding trench, according to one embodiment of the present disclosure.

An ion implantation process is then performed to doping the semiconductor strips 118A and 118B through the at least two opening 120, whereby each of the semiconductor strips 118A (or the semiconductor strip 118B) may include a first doping region 118A1 (118B1), a second doping region 118A2 (118B2) and a channel region 118A3 (118B3) disposed between the first doping region 118A1 (118B1) and the second doping region 118A2 (118B2) (see FIG. 1I and FIG. 3 as discussed in the following description). In some embodiments of the present application, the channel region 118A3 (118B3) may have a dopant concentration less than that of the corresponding first doping region 118A1 (118B1) and the second doping region 118A2 (118B2).

In the present embodiment, the first doping region 118A1 and the second doping region 118A2 may be two n-type buried diffusion regions formed on opposite side of the semiconductor strips 118, respectively extending from the top surface of the multi-layers stacking structure 11 to the bottom of the corresponding trenches 11, and being adjacent to the floating gates 116 with in the two corresponding stacks. The channel region 118A3 (118B3) is disposed between and connects to the first doping region 118A and the second doping region 118B, and overlaps with each of the corresponding floating gates 116 (see FIG. 3).

As the result, a plurality of memory cells 121 are formed on sidewalls of the corresponding trench 110. FIG. 3 is a prospective view illustrating one of the memory cells 121 formed on sidewalls of the corresponding trench 110, according to one embodiment of the present disclosure. For the purpose of clear description, some elements, such as the insulating layers 103, are omitted. In the present embodiment, each of the plurality of memory cells 121 comprises one of the conductive strips 111A (or the conductive strip 111A'), one of the floating gates 116 overlapping with the corresponding conductive strip 111A (111A'), the portions of the U-shaped dielectric strip 117 and the semiconductor strip 118A (118B) both interleaved with the corresponding floating gate 116.

Wherein the corresponding conductive strip 111A (111A) may serve as the control gate of the memory cell 121 that can be connected to the word line WL of the 3D memory device 10; the first doping region 118A1 (118B1) and the second doping region 118A2 (118B2) of the semiconductor strip 118 A (118B) may respectively serve as the source terminal and the drain terminal of the memory cell 121; and the channel region 118A3 (118B3) may serve as the channel region of the memory cells 121. The effective channel length Lg of the memory cell 121 is the distance between the first doping region 118A1 (118B1) and the second doping region 118A2 (118B2). The effective channel width W of the memory cell 121 is the thickness of the conductive strip 111A (111A'), The memory cells 121 that are formed on the same sidewall of the corresponding trench 110 can be connected in parallel both at the source terminal (the first doping region 118A1 (118B1)) and the drain terminal (the second doping region 118A2 (118B2)) thereof.

During the programming operation, the memory cells 121 can be turn on by applying a programming voltage on the corresponding conductive strip (to take the conductive strip 111A as an example) serving as the control gate, current C coming from the source (the first doping region 118B1) may flow through the channel region 118B3 to the drain (the second doping region 118B2), and electrons may be injected passing through the U-shaped dielectric strip 117 and stored in the floating gates 116 to alter the threshold voltage (Vt) of the memory cell 121. A variety of program processes can be utilized. During the erasing operation, the corresponding conductive strip 111A' (the control gate) can be applied negative erase voltage, and induce Fowler-Nordheim (FIN) hole tunneling to the floating gate. A variety of erase processes can be utilized. During the read operation, a sensing voltage can be applied to the corresponding conductive strip 111A' (the control gate) to determine the Vt of the memory cell 121.

Because the floating gate 116 in each of the memory cell 121 isolated from each other in all directions (such as the directions respectively parallel to the X-axis, the Y-axis and the Z-axis), thus there is no charge lateral spreading effect that could deteriorate the retention observed in the floating gates 116. Such that, the memory cell 121 may generally have better retention reliability than a traditional charge-trapping memory device.

Figure 4:
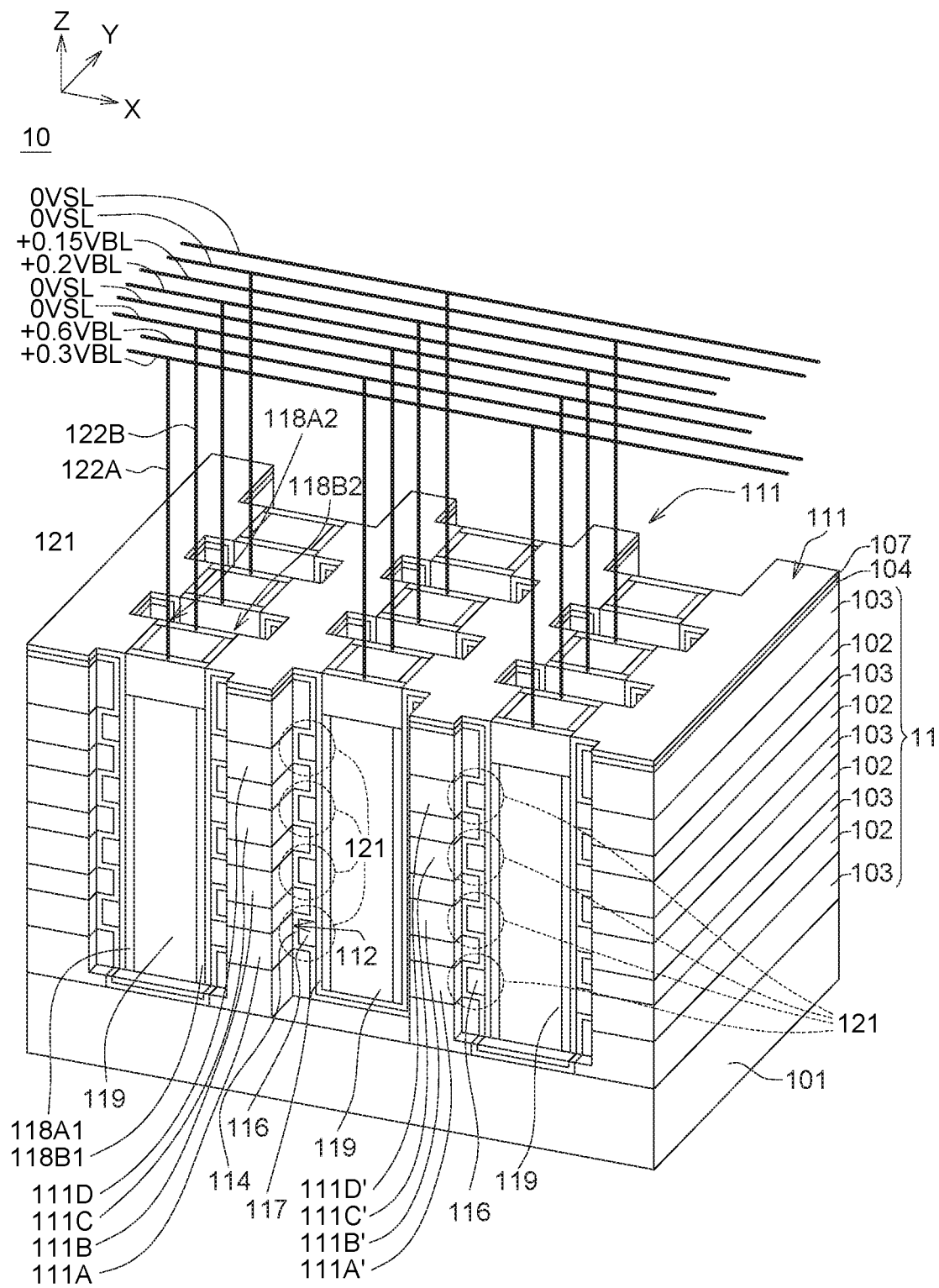
FIG. 4 is a prospective view illustrating a 3D memory device, in accordance with one embodiment of the present disclosure.

Subsequent, a series of downstream processes are carried out to form a plurality of interconnection structures 122A and 122B for connecting the source terminal (the first doping regions 118A1 and 118B1) and the drain terminal (the second doping regions 118A2 and 118B2) of the parallel connected memory cells 121 to the corresponding source lines SL and the corresponding bit lines BL, and the 3D memory device 10 as shown in FIG. 4 can be obtained.

In the present disclosure, both the bit lines BL and source lines SL can be arranged in parallel direction. Besides, the memory cells 121, as depicted in FIG. 4, can be arranged in a twisted layout structure, in which there are two stacks of memory cells respectively connected in parallel inside each trench 110, which share the same bit line BL and source line SL by the common interconnection structures 122A and 122B, but they do not share the same word line (respectively using the conductive strips 111A-111D and conductive strips 111A-111D' as their word lines), whereby the density of bit lines BL and source lines SL can be doubled. In comparison with a traditional 3D memory device with a NOR-type memory cells array, the twisted layout structure of the memory cells 121 can contain more bit lines BL and source lines SL arranged in the same area and the bandwidth of the 3D memory device 10 can be significantly increased.

Meanwhile, there are two stacks of memory cells 121 connected in parallel, respectively disposed in the two adjacent trenches 110 and share the same word line (such as using the conductive strips 111A-111D as their common word lines), but not share the same bit line BL and source line SL, relying on the twisted layout structure that can automatically separate the bit lines BL and source lines SL of these two stacks of memory cells 121 by a lateral shift, the problems of sneak paths during programming operation can be prevented, yet allowing channel hot electron injection or F/N tunneling occurred during the programming/erasing operations of the 3D memory device 10.

In some embodiments of the present disclosure, the 3D memory device 10 may further include a gate driver 1940 coupled to the conductive strips 111A-111B and 111A'-111B' through a plurality of gate lines 1945 and at least one word line decoder (not shown), an input driver 1970 coupled to each first doping region 118A1 (118B1) of the memory cells 121 through a plurality of bit lines BL and at least one bit line decoder (not shown) and a sensing circuit 1950 coupled to each second doping region 118A2 (118B2) of the memory cells 121 through a plurality of source lines SL and at least one source line decoder (not shown).

Figure 5:
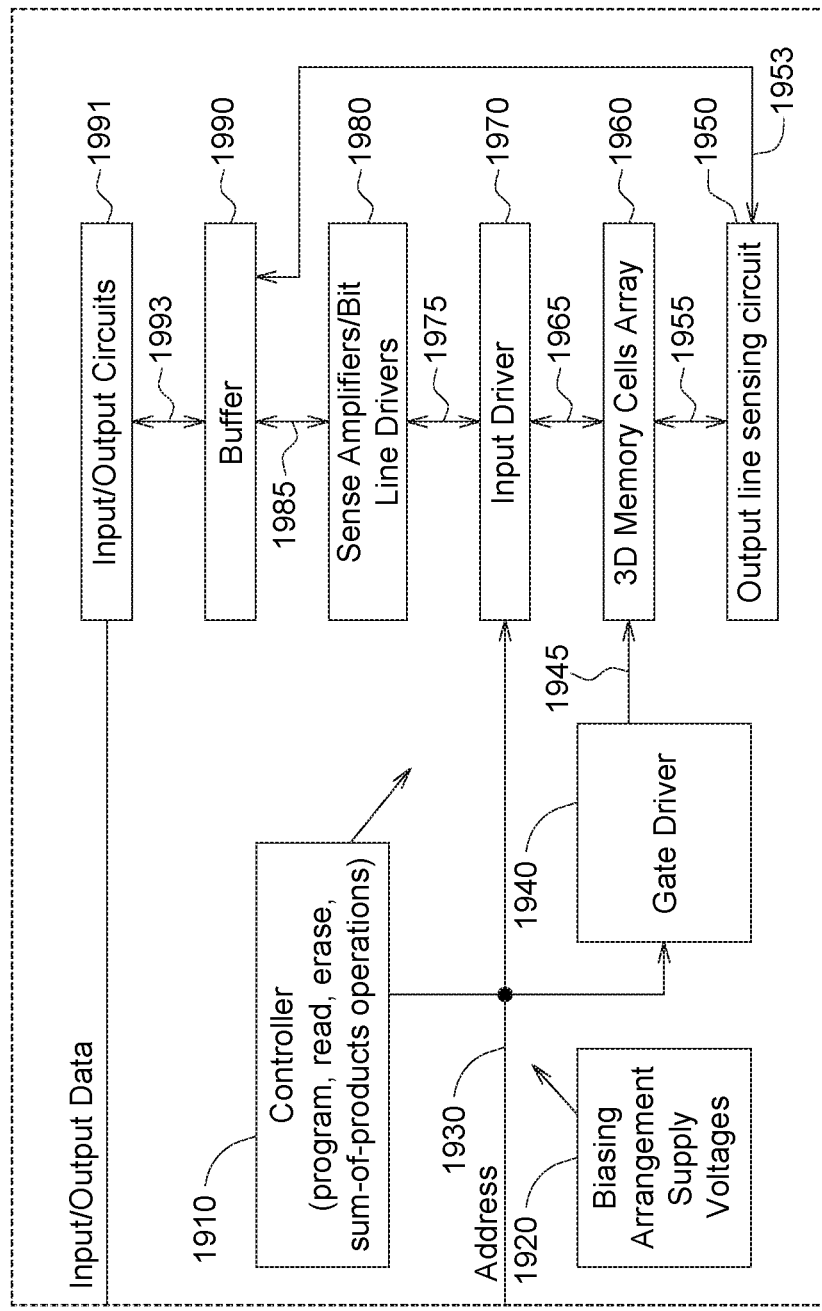
FIG. 5 is a simplified block diagram of a 3D memory device in accordance with one embodiment of the present disclosure.

FIG. 5 is a simplified block diagram of a 3D memory device 10 in accordance with one embodiment of the present disclosure. The memory cells 121 in the multi-layers stacking structure 11 are arranged as a 3D memory cells array 1960. A plurality of input lines 1965 is connected to the bit lines BL. A plurality of output lines 1955 is connected to the source lines SL. A gate driver 1940 is coupled to the gate lines 1945 for applying control gate voltages in response to address signals (e.g. on bus 1930) to select memory cells 121 in the 3D memory cells array 1960. An input driver 1970 is coupled to the plurality of input lines 1965 for inputting data. A sensing circuit 1950 is coupled to the plurality of output lines 1955 to sense a sum of currents in a set of output lines in the plurality of output lines, and is in turn coupled to the buffer circuits 1990 via a bus 1953 to store sensing results in the buffer circuits 1990.

Addresses are supplied on bus 1930 from control logic (controller) 1910 to an input driver 1970 and a gate driver 1940. Voltage sensing sense amplifiers in circuits 1980 are coupled to the input driver 1970 via lines 1975, and are in turn coupled to buffer circuits 1990. Buffer circuits 1990 can be coupled with the sense amplifiers in circuits 1980 via a bus 1985 to store program data for programming of the transistors in the cells in the array. Buffer circuits 1990 can be coupled with the input/output circuits 1991 via a bus 1993. Also, the control logic 1910 can include circuits for selectively applying program voltages to the transistors in the cells in the array in response to the program data values in the buffer circuits 1990.

Input/output circuits 1991 drive the data to destinations external to the 3D memory device 10. Input/output data and control signals are moved via data bus 1905 between the input/output circuits 1991, the control logic 1910 and input/output ports on the 3D memory device 10 or other data sources internal or external to the 3D memory device 10, such as a general purpose processor or special purpose application circuitry, or a combination of modules providing system-on-a-chip functionality supported by the array of cells 1960.

The control logic 1910 is coupled to the buffer circuits 1990 and the array of cells 1960, and to other peripheral circuits used in memory access and in memory sum-of-products operations. Control logic 1910, using a bias arrangement state machine, controls the application of supply voltages generated or provided through the voltage supply or supplies in block 1920, for memory operations in some embodiments. In other embodiments, control logic 1910, using a bias arrangement state machine, controls the application of supply voltages generated or provided through the voltage supply or supplies in block 1920.

The control logic 1910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The 3D memory device 10 may be applied for execution of a sum-of-products operation. During the sum-of-products operation, the gate driver (e.g. the gate driver 1940 in FIG. 5) may apply control gate voltages which in combination with the programmable conductance of the memory cells 121 correspond to weights Wxyz of terms in the sum-of-products operation: the input driver (e.g. the input driver 1970 in FIG. 5) may apply voltages to the memory cells 121 corresponding to input variables Xi; and the sensing circuit (e.g. the sense amplifiers in circuits 1980 in FIG. 5) may sense a sum of currents from the memory cells 121 corresponding to the sum-of-products.

For example, refer back to FIG. 4, a plurality of memory cells are selected to apply bias voltages at the corresponding word line WL (i.e. +4V), while un-selected word lines WL are floated (i.e. 0V), wherein the data information stored in each memory cells 121, which is the conductance (Id/Vd) of the memory cells and the value can be adjusted by programmed/erased, may be referred to as the weighting factor (W(x,y,z)); a plurality of bit lines BL can be parallel selected with various BL biases (+0.3V, +0.6V, +0.2V and +0.5V), which stand for the input signals ($X_i$), to carry out summed product; and the currents that are summed in the source lines SL can be referred to as the sum of the products of the variable inputs $X_i$ and the weights W(x,y,z).

In accordance with the aforementioned embodiments of the present disclosure, a 3D memory device for execution of a sum-of-products operation and the method for fabricating the same are provided, wherein the 3D memory device includes a plurality of memory cells each having a charge trapping structure and a floating gate, vertically stacked in a multi-layers stacking structure and connected in parallel. By this arrangement, a twisted layout structure can be obtained and both the bit lines and source lines used to connect to the memory cells can be arranged in parallel direction, whereby more bit lines and source lines can be arranged in the same area, and the bandwidth of the 3D memory device can be significantly increased.

Meanwhile, the twisted layout structure that can automatically separate the bit lines and source lines respectively connecting to two different stacks of memory cells by a lateral shift. Such that the sneak paths problems occur during programming operation can be prevented. In addition, the floating gate can be configured to further improve the retention reliability of the 3D memory device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) memory device, comprising:
   a multi-layers stacking structure, comprising a plurality of conductive layers, a plurality of insulating layers, at least one trench and a plurality of recess regions, wherein the plurality of insulating layers and the plurality of conductive layers are stacked along a stacking direction in a staggered manner, the at least one trench passes through the plurality of conductive layers, and each one of the plurality of recess regions extends into one of the plurality of conductive layers from the at least one trench;
   a dielectric blocking strip, disposed in the at least one trench and the plurality of recess regions to at least partially overlapping the plurality of conductive layers;
   a plurality of floating gates, each of which is disposed in one of the plurality of recess regions, and isolated from the plurality of conductive layers by the dielectric blocking strip;
   a dielectric strip, disposed in the at least one trench, overlying sidewalls of the plurality of floating gates exposed from the plurality of recess regions; and
   a semiconductor strip, disposed in the at least one trench, insulated from the plurality of floating gates by the dielectric strip, and comprising:
      a first doping region, adjacent to the plurality of floating gates;
      a second doping region, adjacent to the plurality of floating gates; and
      a channel region, disposed between and connecting to the first doping region and the second doping region, and overlapping with each of the plurality of floating gates.

2. The 3D memory device according to claim 1, further comprising:
   a gate driver, coupled to the plurality of conductive layers for applying a plurality of control gate voltages;
   an input line, connected to an input driver and to the first doping region; and
   an output line, connected to a sensing circuit and the second doping region.

3. The 3D memory device according to claim 1, wherein a plurality of memory cells are formed on side walls of the at least one trench, and each of the plurality of memory cells comprises one of the plurality of the conductive layers, one of the plurality of the floating gate corresponding to the one of the plurality of the conductive layers, as well as portions of the dielectric blocking strip, the dielectric strip and the semiconductor strip that are interleaved with the one of the plurality of the floating gate.

4. The 3D memory device according to claim 3, wherein the first doping region and the second doping region respectively serve as a first connecting line and a second connecting line connected the plurality of memory cells in parallel.

5. The 3D memory device according to claim 1, further comprising an opposite semiconductor strip disposed in the at least one trench, wherein the semiconductor strip and the opposite semiconductor strip are separated from each other and laid on opposite side-walls of the at least one trench.

6. The 3D memory device according to claim 1, further comprising at least two adjacent stacks of memory cells respectively connected in parallel and formed in different ones of the at least one trench, wherein the at least two adjacent stacks of memory cells connect to different bit lines and different source lines, but both connect to a plurality of conductive strips of the multi-layers stacking structure; and two adjacent ones of the different source lines are separated by a lateral shift.

7. The 3D memory device according to claim 1, wherein plural floating gates of the plurality of floating gates disposed at the same one of the conductive layers are arranged along a direction perpendicular to the stacking direction and parallel to an extending direction of the at least one trench.

8. A three-dimensional (3D) memory device, comprising:
   a multi-layers stacking structure, comprising a plurality of conductive layers, a plurality of insulating layers, at least one trench and a plurality of recess regions, wherein the plurality of insulating layers and the plurality of conductive layers are stacked along a stacking direction in a staggered manner, the at least one trench passes through the plurality of conductive layers, and each one of the plurality of recess regions extends into one of the plurality of conductive layers from the at least one trench;
   a dielectric blocking strip, disposed in the at least one trench and the plurality of recess regions to at least partially overlapping the plurality of conductive layers;
   a plurality of floating gates, each of which is disposed in one of the plurality of recess regions, and isolated from the plurality of conductive layers by the dielectric blocking strip;
   a dielectric strip comprising silicon oxide, disposed in the at least one trench, overlying sidewalls of the plurality of floating gates exposed from the plurality of recess regions; and
   a semiconductor strip, disposed in the at least one trench, insulated from the plurality of floating gates by the dielectric strip, and comprising:
      a first doping region, adjacent to the plurality of floating gates;
      a second doping region, adjacent to the plurality of floating gates, wherein the first doping region and the second doping region have the same dopant type; and
      a channel region, disposed between and connecting to the first doping region and the second doping region, and overlapping with each of the plurality of floating gates.

9. The 3D memory device according to claim 8, further comprising an opposite semiconductor strip disposed in the at least one trench, wherein the semiconductor strip and the opposite semiconductor strip are separated from each other and laid on opposite side-walls of the at least one trench.

10. The 3D memory device according to claim 8, further comprising at least two adjacent stacks of memory cells respectively connected in parallel and formed in different ones of the at least one trench, wherein the at least two adjacent stacks of memory cells connect to different bit lines and different source lines, but both connect to a plurality of conductive strips of the multi-layers stacking structure; and two adjacent ones of the different source lines are separated by a lateral shift.

11. The 3D memory device according to claim 8, wherein plural floating gates of the plurality of floating gates disposed at the same one of the conductive layers are arranged along a direction perpendicular to the stacking direction and parallel to an extending direction of the at least one trench.

12. A method for fabricating a 3D memory device, comprising:
   providing a multi-layers stacking structure; wherein the multi-layers stacking structure comprises a plurality of conductive layers, a plurality of insulating layers, at least one trench and a plurality of recess regions; the plurality of insulating layer and the plurality of conductive layers are stacked along a stacking direction in a staggered manner; the at least one trench passes through the plurality of conductive layers; and each one of the plurality of recess regions extends into one of the plurality of conductive layers from the at least one trench;
   forming a dielectric blocking strip in the at least one trench and the plurality of recess regions to at least partially overlapping the plurality of conductive layers;
   forming a plurality of floating gates, to make each of the plurality of floating gates disposed in one of the plurality of recess regions, and isolated from the plurality of conductive layers by the dielectric blocking strip;
   forming a dielectric strip in the at least one trench, overlying sidewalls of the plurality of floating gates exposed from the plurality of recess regions;
   forming a semiconductor strip in the at least one trench to make the semiconductor strip being insulated from the plurality of floating gates by the dielectric strip, wherein the semiconductor strip comprises:
      a first doping region, adjacent to the plurality of floating gates;
      a second doping region, adjacent to the plurality of floating gates; and
      a channel region, disposed between and connecting to the first doping region and the second doping region, and overlapping with each of the plurality of floating gates.

13. The method according to claim 12, wherein the step for forming the plurality of recess regions comprises performing an etch back process to remove portions of the plurality of conductive layers and expose portions of the plurality of the insulating layers.

14. The method according to claim 13, after forming the plurality of recess regions, further comprising:
   forming a dielectric blocking layer comprises an ONO structure lining on sidewalls of the at least one trench and sidewalls of the plurality of recess regions;
   filing the plurality of recess regions with poly-silicon to form a plurality of poly-silicon bars extending parallel to the at least one trench;
   forming a dielectric layer overlying the sidewalls of the at least one trench and the plurality of poly-silicon bars;
   forming a semiconductor layer overlying the dielectric layer;
   filling the trench with a dielectric material;

forming at least two openings extending downwards along a direction parallel to the stacking direction from a top surface of the multi-layers stacking structure and passing through the dielectric blocking layer, the plurality of poly-silicon bars, the dielectric layer, the dielectric material and the semiconductor layer; and doping the remaining semiconductor layer through the at least two openings.

15. The method according to claim 14, prior to the forming of the at least two openings, further comprising:

etching back a portion of the dielectric material to expose a portion of the semiconductor layer; and forming at least one contact plug connecting to the exposed portion of semiconductor layer.

* * * * *